United States Patent
Kouzuki et al.

(10) Patent No.: US 6,521,954 B1
(45) Date of Patent: Feb. 18, 2003

(54) SEMICONDUCTOR DEVICE AND MANUFACTURING METHOD THEREOF

(75) Inventors: Shigeo Kouzuki, Kawasaki (JP); Yasunori Usui, Yokohama (JP); Tatsuo Yoneda, Ibo-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 10/023,942

(22) Filed: Dec. 21, 2001

(51) Int. Cl.[7] ............................................. H01L 29/72
(52) U.S. Cl. ...................... 257/374; 257/330; 257/335; 257/347; 257/655
(58) Field of Search ............................... 257/374, 330, 257/335, 347, 655

(56) References Cited

U.S. PATENT DOCUMENTS

| | | |
|---|---|---|
| 4,754,310 A | 6/1988 | Coe |
| 5,438,215 A | 8/1995 | Tihanyi |
| 6,040,600 A * | 3/2000 | Uenishi et al. ............. 257/330 |

FOREIGN PATENT DOCUMENTS

| | | |
|---|---|---|
| JP | 7-7154 | 1/1995 |
| JP | 8-222735 | 8/1996 |
| JP | 9-266311 | 10/1997 |
| JP | 10-223896 | 8/1998 |
| JP | 10-284591 | 10/1998 |
| JP | 11-233759 | 8/1999 |
| JP | 2000-183348 | 6/2000 |
| JP | 2000-208527 | 7/2000 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A semiconductor device includes a first semiconductor layer of a first conductivity type and a second semiconductor layer of a second conductivity type juxtaposed on a semiconductor substrate of the first conductivity type. The first semiconductor layer has an impurity concentration lower than that of the semiconductor substrate. The second semiconductor layer has at a central location a trench, which extends from the upper end toward the semiconductor substrate. A first region of the second conductivity type is formed to include an upper portion of the second semiconductor layer. A second region of the first conductivity type is formed in a surface of the first region. A gate electrode is disposed, through an insulating film, on a channel region, which is a surface portion of the first region between the second region and an upper portion of the first semiconductor layer.

20 Claims, 9 Drawing Sheets

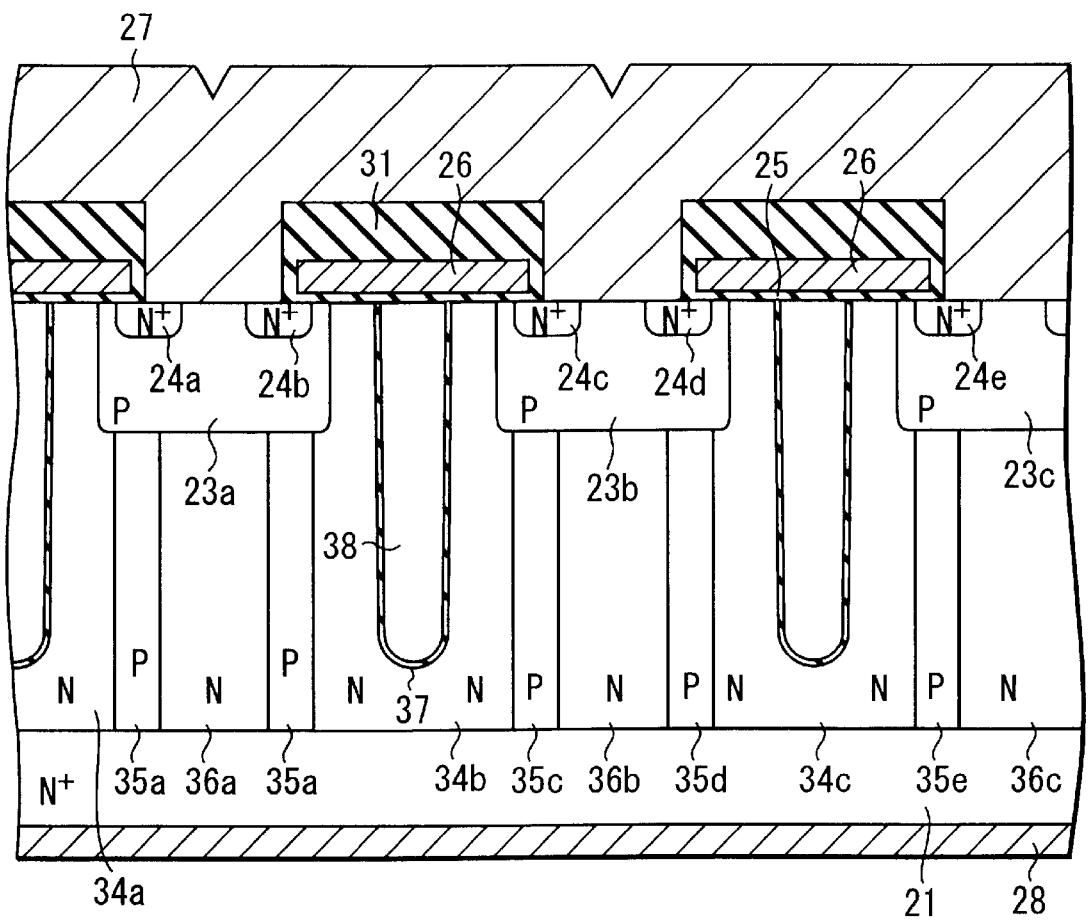
FIG. 10
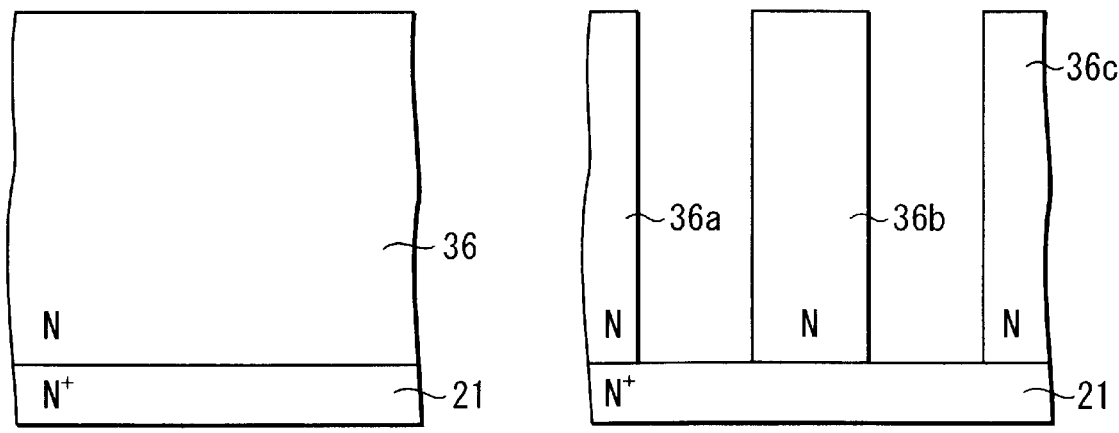
FIG. 11
FIG. 12

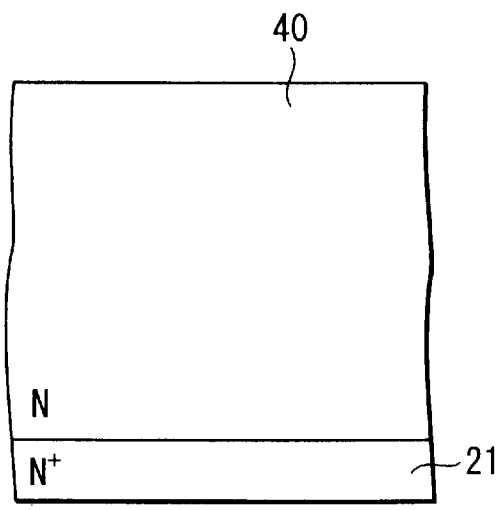
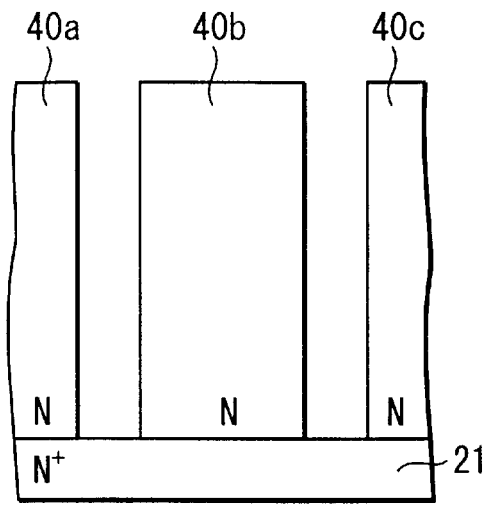
FIG. 19        FIG. 20
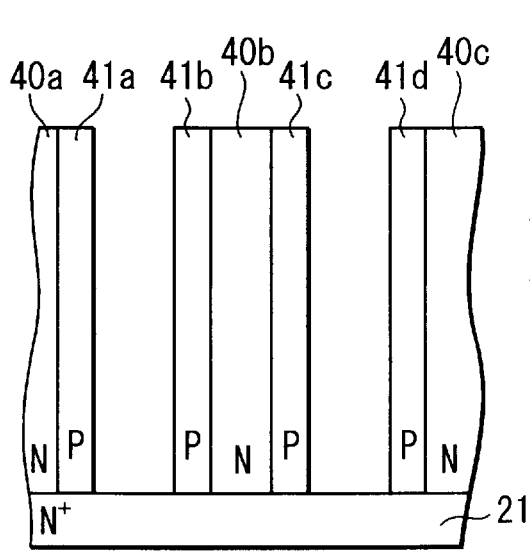
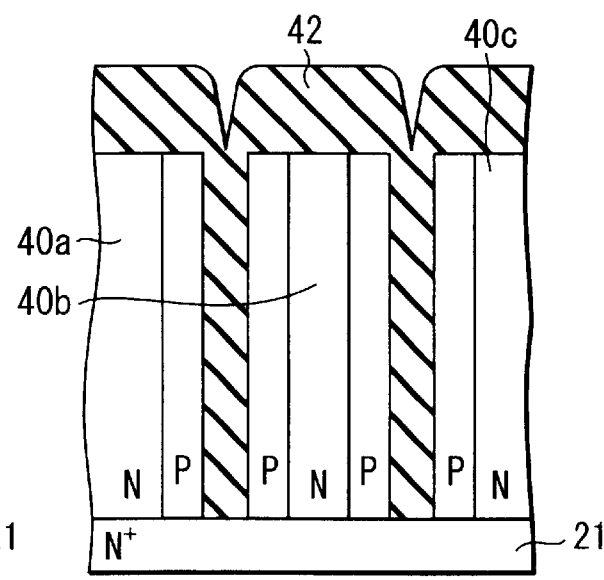
FIG. 21        FIG. 22

SEMICONDUCTOR DEVICE AND MANUFACTURING METHOD THEREOF

BACKGROUND OF THE INVENTION

1. Field of the Invention

The present invention relates to a semiconductor device and manufacturing method thereof used for power control, and particularly to a planar-type insulated-gate field effect transistor and manufacturing method thereof.

2. Description of the Related Art

FIG. 25 is a sectional view showing a conventional planar-type insulated-gate field effect transistor (MOSFET). An $N^-$-epitaxial layer 2 is formed on an $N^+$-silicon substrate 1 to make the drain region of the MOSFET. A plurality of P-base diffusion regions 3a and 3b are selectively formed by diffusion in the surface of the $N^-$-epitaxial layer 2. $N^+$-source diffusion regions 4a and 4b are selectively formed by diffusion in the surfaces of the P-base diffusion regions 3a and 3b, respectively.

A gate electrode 6 of polycrystalline silicon is formed, through a gate oxide film 5, on the portion that extends from the $N^+$-source diffusion region 4a and the P-base diffusion region 3a on one side, through a surface portion of the $N^-$-epitaxial layer 2, to the P-base diffusion region 3b and the $N^+$-source diffusion region 4b on the other side. A source electrode 7 is formed on and connected to the P-base diffusion regions 3a and 3b and the $N^+$-source diffusion regions 4a and 4b. A drain electrode 8 is formed on a surface of the $N^+$-silicon substrate 1 opposite the $N^-$-epitaxial layer 2.

A MOSFET unit cell is formed of the $N^+$-source diffusion region 4a and the $N^-$-epitaxial layer 2, with a channel region using a surface portion of the P-base diffusion region 3a under the gate electrode 6. When the gate electrode 6 is supplied with a positive voltage higher than a threshold value, an inversion layer appears in the surface of the channel region to bring the MOSFET into an ON-state. The ON-current flows from the drain electrode 8, through the $N^+$-silicon substrate 1, $N^-$-epitaxial layer 2, the inversion layer formed in the channel region, and the $N^+$-source diffusion region 4a, into the source electrode 7.

Since the MOSFET having this structure deals with a large current, the ON-resistance is preferably smaller. In an ON-state of the MOSFET, a current passageway is formed from the drain electrode 8 to the source electrode 7. Resistance components generated in the current passageway are roughly composed of a resistance (REpi) in the epitaxial portion of the $N^-$-epitaxial diffusion region 2, a resistance (RJFET) in the junction portion, and a channel resistance (Rch) in the channel region.

In order to reduce the ON-resistance, it is necessary to reduce the resistance (REpi) in the epitaxial portion. This is easily realized by increasing the impurity concentration of the $N^-$-epitaxial layer 2. However, where the impurity concentration of the $N^-$-epitaxial layer 2 is increased, the maximum value of electrical field intensity provided directly under the P-base diffusion regions 3a and 3b in an OFF-state of the MOSFET grows higher, thereby bringing about a decrease in the reverse breakdown voltage between the source and drain. Accordingly, it is necessary to control the impurity concentration of the $N^-$-epitaxial layer 2, so that the maximum value of an electrical field intensity to be obtained does not exceed the maximum value of the electrical field intensity of the $N^-$-epitaxial layer 2. As a result, the MOSFET shown in FIG. 25 is limited, in terms improvement to obtain both of a decreased ON-resistance and a stable reverse breakdown voltage between the source and drain.

Jpn. Pat. Appln. KOKAI Publication No. 9-191109 discloses a technique of forming P-buried layers in an $N^-$-epitaxial layer, in order to increase the impurity concentration of the $N^-$-epitaxial layer to reduce the ON-resistance, while to prevent the reverse breakdown voltage between the source and drain from lowering due to this. FIG. 26 is a sectional view showing a MOSFET structure of this kind with a high breakdown voltage MOSFET. An $N^-$-epitaxial layer 12 is formed on an $N^+$-silicon substrate 11. A plurality of P-base diffusion regions 13a and 13b are selectively formed in the surface of the $N^-$-epitaxial layer 12. $N^+$-source diffusion regions 14a and 14b are selectively formed in the surfaces of the P-base diffusion regions 13a and 13b, respectively.

A gate electrode 16 is formed, through a gate oxide film 15, on the portion that extends from the $N^+$-source diffusion region 14a and the P-base diffusion region 13a on one side, through a surface portion of the $N^-$-epitaxial layer 12, to the P-base diffusion region 13b and the $N^+$-source diffusion region 14b on the other side. A source electrode 17 is formed on and connected to the P-base diffusion regions 13a and 13b and the $N^+$-source diffusion regions 14a and 14b. A drain electrode 8 is formed on a surface of the $N^+$-silicon substrate 11. A plurality of P-buried layers 19a and 19b are formed in the $N^-$-epitaxial layer 12. The P-buried layers 19a and 19b are not connected to any portion, but are in an electrically floating state.

In this MOSFET with a high breakdown voltage, when a reversely applied voltage is low in an OFF-state, a depletion layer expands in the upper $N^-$-epitaxial layer 12 from the P-base diffusion regions 13a and 13b toward the drain electrode 18, as in the MOSFET shown in FIG. 25. At this time, the maximum electrical field intensity appears at a position near the interfaces between the P-base diffusion regions 13a and 13b and the $N^-$-epitaxial layer 12.

When the applied voltage reaches a certain value, a portion of the $N^-$-epitaxial layer 12 between the P-base diffusion regions 13a and 13b and the P-buried layers 19a are depleted, and the P-buried layers 19a are turned into a punch-through state, thereby fixing the electrical potential. Consequently, the maximum value of the electrical field on the P-base diffusion regions 13a and 13b side is prevented from increasing. When the applied voltage further increases, the depletion layer further expands in the $N^-$-epitaxial layer 12 toward the drain electrode 18. However, when the depletion layer reaches the P-buried layers 19b, the P-buried layers 19b are also turned into a punch-through state similarly to the punch-through state of the P-buried layers 19a, so that the maximum value of the electrical field is prevented from increasing.

However, even the semiconductor device shown in FIG. 26 entails the following problems. Specifically, since the P-buried layers 19a and 19b formed in the $N^-$-epitaxial layer are in an electrically floating state, their electrical potential fluctuates when the MOSFET is switched. Immediately after the device is changed from a reversely biased state into an ON-state, since holes in the P-buried layers 19a and 19b have disappeared, a high electrical potential is required for their depletion. So long as this electrical potential is held, a depletion layer expands in the $N^-$-epitaxial layer 12, and the resistance of the layer 12 increases. The holding time of the electrical potential in the P-buried layers 19a and 19b is too long to perform switching at high-speed.

Furthermore, when the P-buried layers 19a and 19b are formed, it is necessary to switch impurities for determining conductivity types so as to alternately grow the N-epitaxial layer 12 and the P-buried layers 19a and 19b. This operation complicates the manufacturing process, and may make the impurity concentration of the N⁻-epitaxial layer 12 non-uniform. As a result, a stable reverse breakdown voltage can hardly be attained.

In light of the conventional problems described above, it is demanded to develop a semiconductor device and manufacturing method thereof, which reduce the ON-resistance of a MOSFET, while they improve the reverse breakdown voltage for a reverse bias applied between the source and drain.

BRIEF SUMMARY OF THE INVENTION

According to a first aspect of the present invention, there is provided a semiconductor device comprising:

a semiconductor substrate of a first conductivity type;

a first semiconductor layer of the first conductivity type and a second semiconductor layer of a second conductivity type juxtaposed on the semiconductor substrate, the first semiconductor layer having an impurity concentration lower than that of the semiconductor substrate, the second semiconductor layer having at a central location a trench, which extends from an upper end of the second semiconductor layer toward the semiconductor substrate;

a first region of the second conductivity type formed to include an upper portion of the second semiconductor layer;

a second region of the first conductivity type formed in a surface of the first region; and a gate electrode disposed, through an insulating film, on a channel region, which is a surface portion of the first region between the second region and an upper portion of the first semiconductor layer.

According to a second aspect of the present invention, there is provided a semiconductor device comprising:

a semiconductor substrate of a first conductivity type;

a first semiconductor layer of the first conductivity type, a second semiconductor layer of a second conductivity type, and a third semiconductor layer of the first conductivity type juxtaposed on the semiconductor substrate, the first and third semiconductor layers having an impurity concentration lower than that of the semiconductor substrate, the third semiconductor layer having at a central location a trench, which extends from an upper end of the third semiconductor layer toward the semiconductor substrate;

a first region of the second conductivity type formed to include an upper portion of the second semiconductor layer;

a second region of the first conductivity type formed in a surface of the first region; and a gate electrode disposed, through an insulating film, on a channel region, which is a surface portion of the first region between the second region and an upper portion of the third semiconductor layer.

BRIEF DESCRIPTION OF THE SEVERAL VIEWS OF THE DRAWING

FIG. 10 is a sectional view showing a semiconductor device according to a third embodiment of the present invention;

FIGS. 11, 12, 13, 14, 15, 16, 17, and 18 are sectional views showing steps of manufacturing the semiconductor device according to the third embodiment;

FIGS. 19, 20, 21, 22, and 23 are sectional views showing steps of manufacturing a semiconductor device according to a fourth embodiment of the present invention;

DETAILED DESCRIPTION OF THE INVENTION

Figure 1:
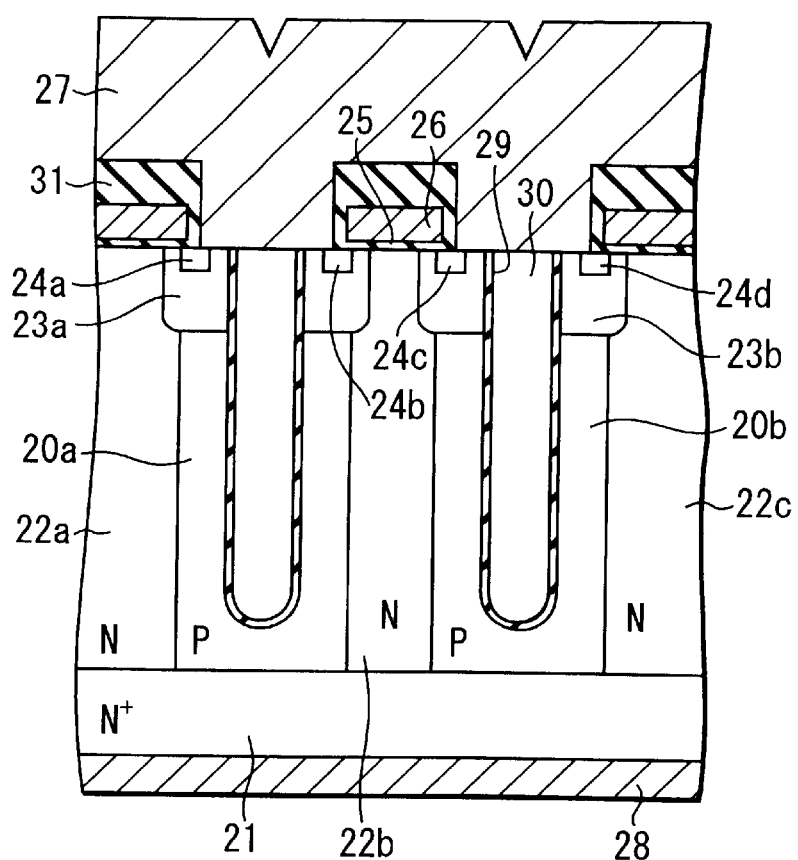
FIG. 1 is a sectional view showing a semiconductor device according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

(First Embodiment)

FIG. 1 is a sectional view showing a planar-type insulated-gate field effect transistor (MOSFET) according to a first embodiment of the present invention. A plurality of N-epitaxial layers 22a to 22c and a plurality of P-epitaxial layers 20a and 20b are repeatedly formed in strips on an N⁺-silicon substrate 21.

In order to obtain a reverse breakdown voltage of 500 to 600V between the source and drain, each thickness of the N-epitaxial layers 22a to 22c and the P-epitaxial layers 20a and 20b is set to be 50 to 60 μm. Also in this case, the N-epitaxial layers 22a to 22c and the P-epitaxial layers 20a and 20b are formed to have an impurity concentration of about $1\times10^{15}$ cm$^{-3}$, although they have different conductivity types. The N⁺-silicon substrate 21 has a high impurity concentration of $1\times10^{19}$ cm$^{-3}$ to $1\times10^{20}$ cm$^{-3}$.

The N⁺-silicon substrate 21 and the N-epitaxial layers 22a to 22c work as the drain region of the MOSFET. P-base diffusion regions 23a and 23b are selectively formed by diffusion in the surface portions (the upper portions) of the P-epitaxial layers 20a and 20b, respectively. N⁺-source diffusion regions 24a to 24d are selectively formed in the surfaces of the P-base diffusion regions 23a and 23b, respectively. A trench is formed to extend from each of the P-base diffusion regions 23a and 23b into the P-epitaxial layers 20a and 20b. The trench is filled with a thermally oxidized insulating film 29 formed on the sidewall and a polycrystalline silicon layer 30.

A gate electrode 26 of polycrystalline silicon is formed, through a gate oxide film 25, on the portion that extends from the N⁺-source diffusion region 24b and the P-base diffusion region 23a on one side, through a surface portion of the N-epitaxial layer 22b, to the P-base diffusion region 23b and the N⁺-source diffusion region 24c on the other side. The gate electrode 26 is covered with an inter-level insulating film 31. In the same manner, a gate electrode is formed, through a gate oxide film, on each of the other N-epitaxial layers formed on the N$^+$-silicon substrate 21. In other words, a combination of source, drain, channel, and gate, which constitutes each MOSFET unit, is repeatedly formed on the N$^+$-silicon substrate 21.

A source electrode 27 is formed on and connected to the P-base diffusion regions 23a and 23b and the N$^+$-source diffusion regions 24a to 24d. A drain electrode 28 is formed on a surface of the N$^+$-silicon substrate 21 opposite the N-epitaxial layers 22a to 22c.

The MOSFET is formed of the N$^+$-source diffusion regions 24a to 24d and the N-epitaxial layers 22a to 22c, with channel regions using surface portions of the P-base diffusion regions 23a and 23b under the gate electrodes 26. When the gate electrodes 26 are supplied with a positive voltage higher than a threshold value, an inversion layer appears in the surface of each channel region to bring the MOSFET into an ON-state. The ON-current flows from the drain electrode 28, through the N$^+$-silicon substrate 21, the N-epitaxial layers 22a to 22c, the channel regions, and the N$^+$-source diffusion regions 24a to 24d, into the source electrode 27.

Figure 25:
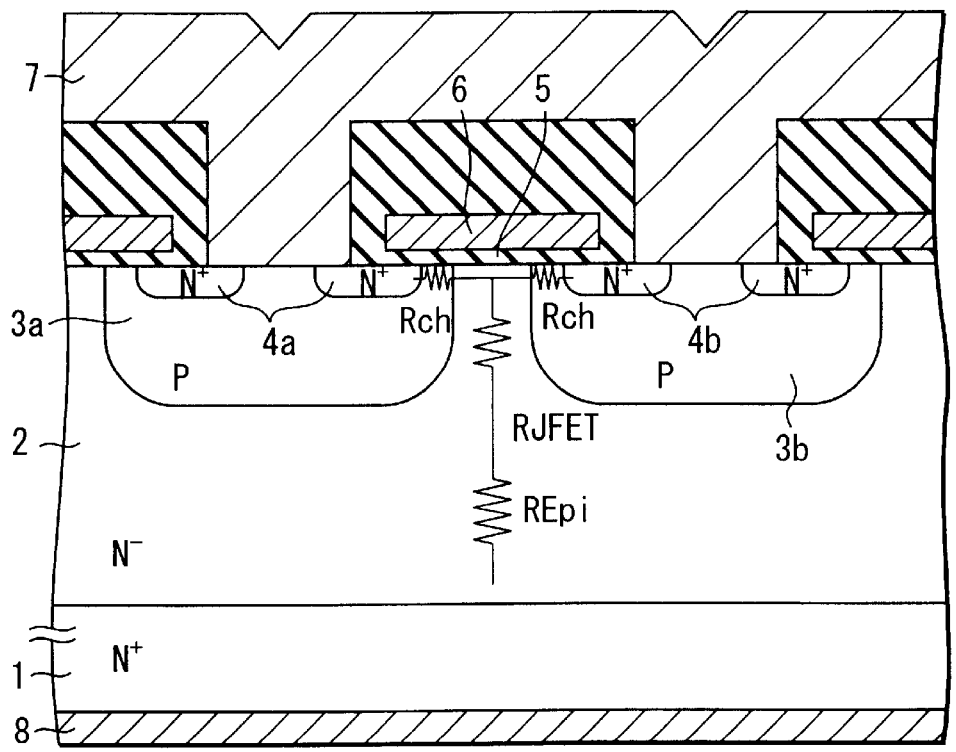
FIG. 25 is a sectional view showing a conventional semiconductor device.
Figure 26:
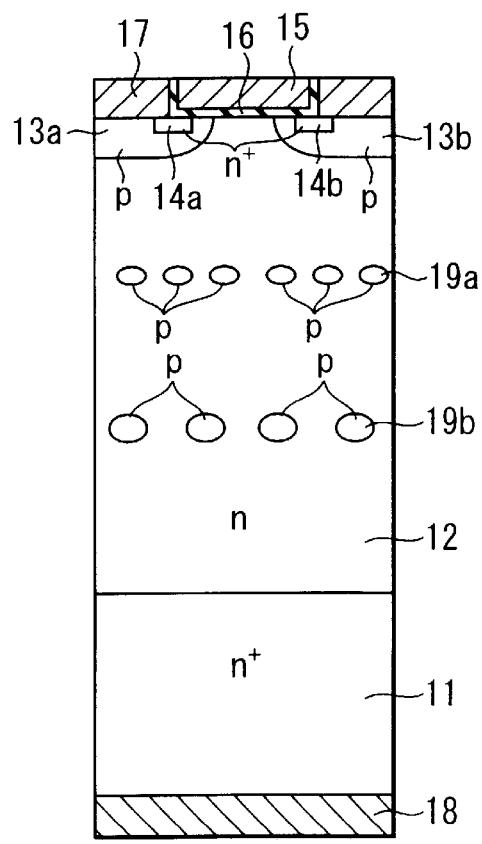
FIG. 26 is a sectional view showing another conventional semiconductor device.

In this planar-type insulated-gate field effect transistor according to the first embodiment, the impurity concentration of the N-epitaxial layers 22a to 22c can be increased, so that the ON-resistance of the MOSFET is remarkably reduced. With the conventional structure shown in FIG. 25, in order to obtain a reverse breakdown voltage of, e.g., 500 to 600V between the source and drain, the impurity concentration of the N-epitaxial layer has to be a low concentration of about $2 \times 10^{14}$ cm$^{-3}$ (a resistivity of 24 Ω·cm), thereby bringing about a high resistance. On the other hand, with the structure according to the first embodiment, the impurity concentration of the N-epitaxial layers 22a to 22c can be about $1 \times 10^{15}$ cm$^{-3}$ to reduce the resistivity to one-fourth the conventional structure, although the current passageway is the same as that of the conventional structure. As a result, the ON-resistance is remarkably reduced.

The first embodiment employs the P-epitaxial layers 20a and 20b, which have an impurity concentration the same as that of the N-epitaxial layers 22a to 22c, thereby solving a problem in that the reverse breakdown voltage between the source and drain decreases due to an increase in the impurity concentration of the N-epitaxial layers 22a to 22c. Specifically, since the N- and P-epitaxial layers are repeatedly disposed in strips, they are completely depleted when a reverse bias is applied between the source and drain in an OFF-state of the MOSFET.

Figure 2:
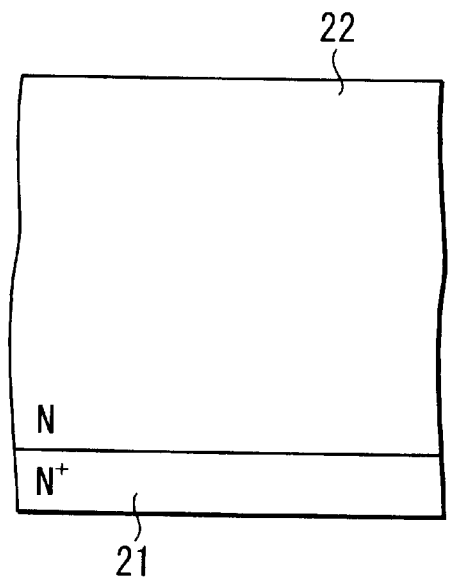
FIGS. 2, 3, 4, 5, 6, 7, and 8 are sectional views showing steps of manufacturing the semiconductor device according to the first embodiment.
Figure 3:
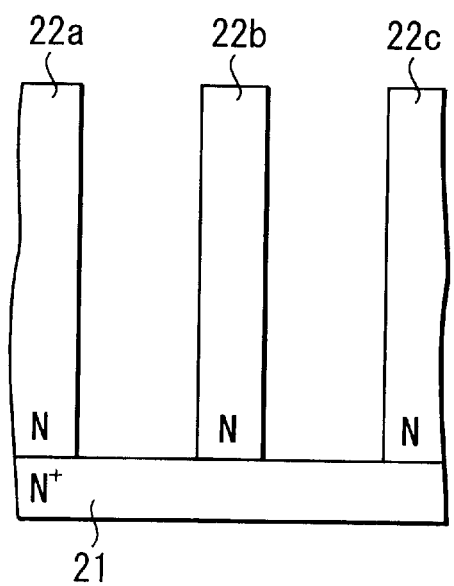

An explanation will be give of steps of manufacturing the planar-type insulated-gate field effect transistor according to the first embodiment, with reference to FIGS. 2 to 8. First, as shown in FIG. 2, an N-epitaxial layer 22 having an impurity concentration of about $1 \times 10^{15}$ cm$^{-3}$ is formed on an N$^+$-silicon substrate 21 having a high impurity concentration. Then, as shown in FIG. 3, the N-epitaxial layer 22 is etched down to the N$^+$-silicon substrate 21 to selectively form trenches. Consequently, the N-epitaxial layer 22 is divided into portions 22a to 22c. Then, in order to remove distortion and crystal defects generated by the trench formation, a thermal oxidizing treatment is performed. A thermally oxidized film formed on the surface by the thermal oxidizing treatment is completely removed.

Figure 4:
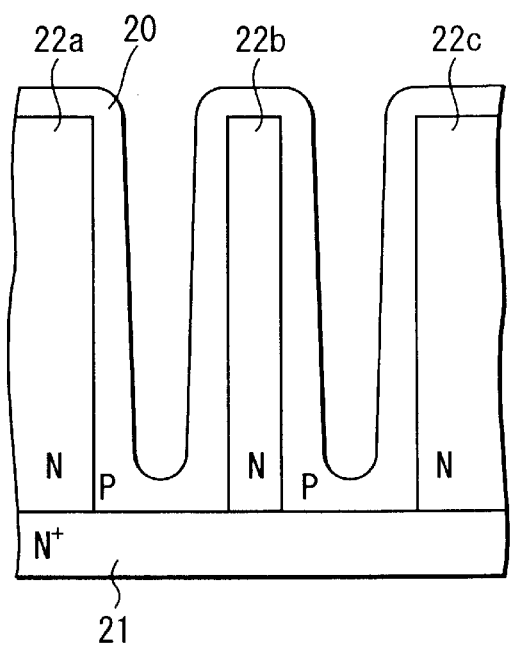
Figure 5:
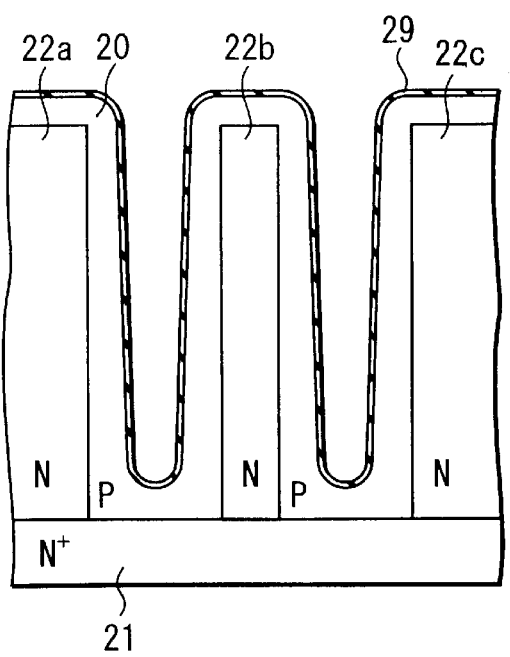
Figure 6:
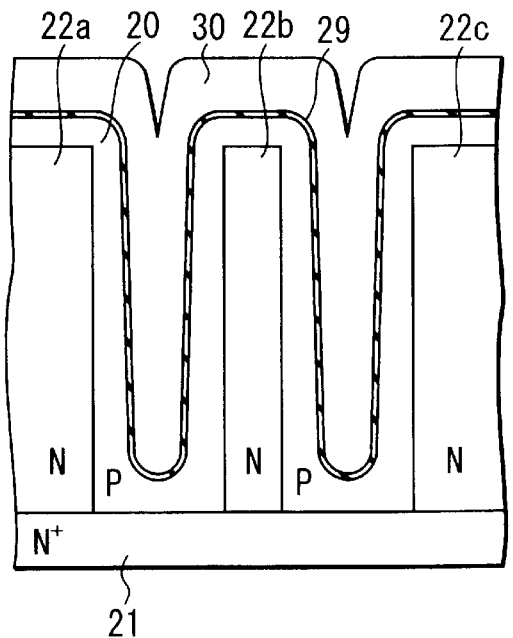

Then, as shown in FIG. 4, a P-epitaxial layer 20 is formed by crystal growth on the N$^+$-silicon substrate 21 and the N-epitaxial layers 22a to 22c. The impurity concentration of the P-epitaxial layer 20 is $1 \times 10^{15}$ cm$^{-3}$, the same as that of the N-epitaxial layers 22a to 22c. Then, as shown in FIG. 5, in order to further reduce crystal defects generated by the trench formation, and suppress leakage current between the source and drain, a thermal treatment is performed, whereby a thermally oxidized insulating film 29 is formed. Then, as shown in FIG. 6, a polycrystalline silicon layer 30 is formed on the insulating film 29 to completely fill up the trenches therewith.

Figure 7:
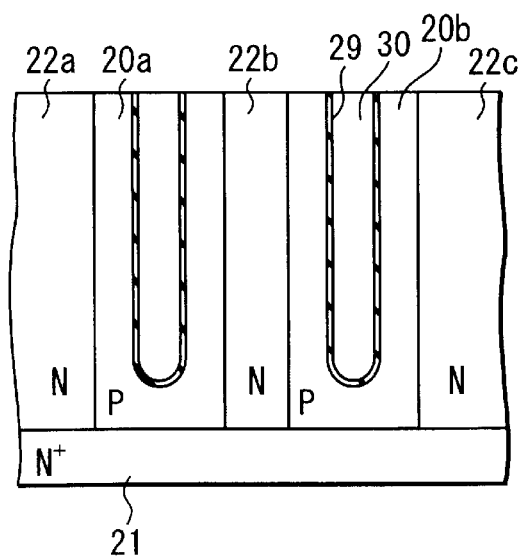

In this state, distortion has not been thoroughly removed from the substrate surface portion (the upper portion) where gate oxide films 25 of the MOSFET are to be formed in a later step. Accordingly, polishing or etching is performed to planarize the surface of the structure obtained after the polycrystalline silicon layer 30 is formed. With the planarization, as shown in FIG. 7, the substrate surface portions of the thermally oxidized insulating film 29, the polycrystalline silicon layer 30, the N-epitaxial layers 22a to 22c, and the P-epitaxial layer 20 are removed. Furthermore, with the planarization, the thickness of the N-epitaxial layers 22a to 22c and the P-epitaxial layer 20 is adjusted to a predetermined value. According to the first embodiment, in order to obtain a reverse breakdown voltage of 500 to 600V between the source and drain, each thickness of the N-epitaxial layers 22a to 22c and the P-epitaxial layers 20a and 20b is set to be 50 to 60 μm.

Figure 8:
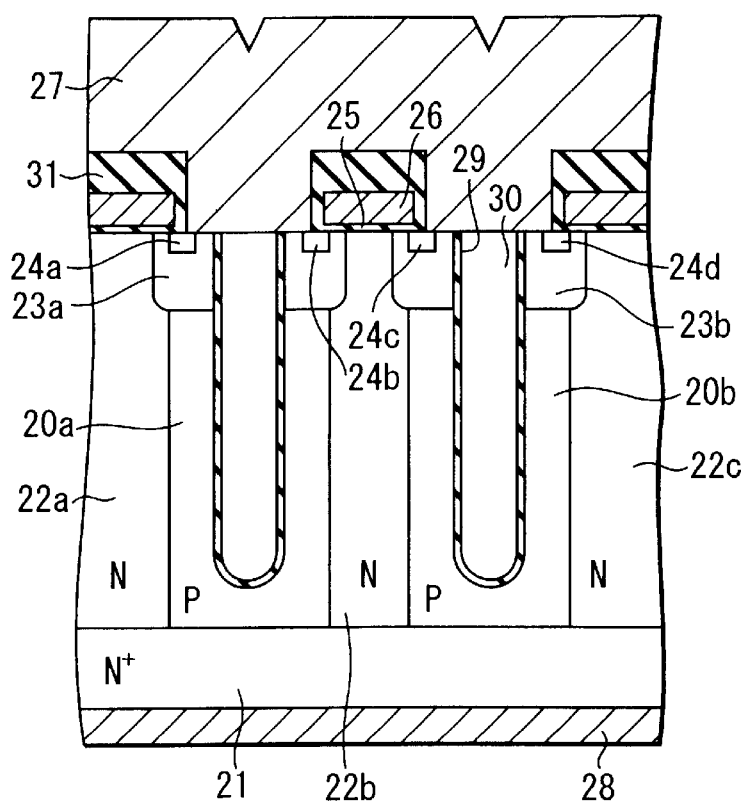

Then, as shown in FIG. 8, P-base diffusion regions 23a and 23b are selectively formed in the substrate surface portions (the upper portions) of the N-epitaxial layers 22a to 22c and the P-epitaxial layers 20a and 20b by diffusing a P-impurity. Furthermore, N$^+$-source diffusion regions 24a to 24d are selectively formed in the surfaces of the P-base diffusion regions 23a and 23b by diffusing an N-impurity. Then, gate oxide films 25, gate electrodes 26, and inter-level insulating films 31 are formed. Then, a source electrode 27 is formed on and connected to the P-base diffusion regions 23a and 23b and the N$^+$-source diffusion regions 24a to 24d. Furthermore, a drain electrode 28 is formed on a surface of the N$^+$-silicon substrate 21 opposite the N-epitaxial layers 22a to 22c.

According to this manufacturing method, a region to be used as the current passageway is free from the effects of crystal distortion and concentration change, caused by an additional manufacturing step for forming the P-epitaxial layer. Consequently, ill effects of the crystal distortion or concentration change on the ON-resistance are suppressed. Furthermore, the N-epitaxial layers and the P-epitaxial layers are easily formed to have impurity concentrations, which are the same as each other, and are uniform in the thickness direction of the substrate. As a result, it is possible to realize a device having a stable reverse breakdown voltage between the source and drain.

(Second Embodiment)

Figure 9:
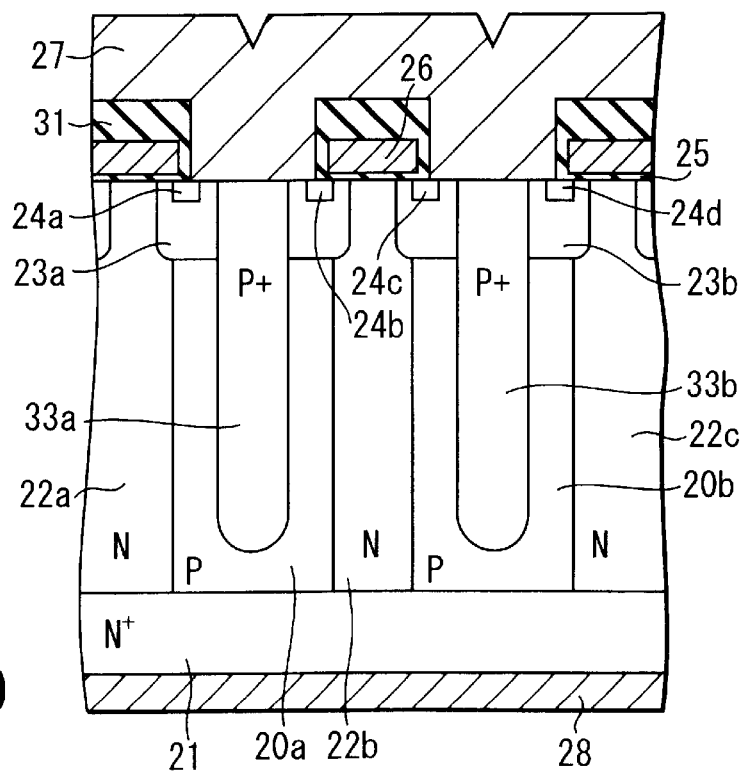
FIG. 9 is a sectional view showing a semiconductor device according to a second embodiment of the present invention.

FIG. 9 is a sectional view showing a planar-type insulated-gate field effect transistor (MOSFET) according to a second embodiment of the present invention. As in the first embodiment, a plurality of N-epitaxial layers 22a to 22c and a plurality of P-epitaxial layers 20a and 20b are repeatedly formed in strips on an N$^+$-silicon substrate 21. The N-epitaxial layers 22a to 22c and the P-epitaxial layers 20a and 20b have a thickness of 50 to 60 μm, and an impurity concentration of about $1 \times 10^{15}$ cm$^{-3}$.

P-base diffusion regions 23a and 23b are selectively formed by diffusion in the surface portions (the upper portions) of the P-epitaxial layers 20a and 20b, respectively. N$^+$-source diffusion regions 24a to 24d are selectively formed in the surfaces of the P-base diffusion regions 23a and 23b, respectively. A trench is formed to extend from each of the P-base diffusion regions 23a and 23b into the P-epitaxial layers 20a and 20b. The trenches are filled with P$^+$-epitaxial layers 33a and 33b, respectively, having an impurity concentration higher than that of the P-base diffusion regions 23a and 23b.

A gate electrode 26 of polycrystalline silicon is formed, through a gate oxide film 25, on the portion that extends from the N$^+$-source diffusion region 24b and the P-base diffusion region 23a on one side, through a surface portion of the N-epitaxial layer 22b, to the P-base diffusion region 23b and the N$^+$-source diffusion region 24c on the other side. The gate electrode 26 is covered with an inter-level insulating film 31. In the same manner, a gate electrode is formed, through a gate oxide film, on each of the other N-epitaxial layers formed on the N$^+$-silicon substrate 21. In other words, a combination of source, drain, channel, and gate, which constitutes each MOSFET unit, is repeatedly formed on the N$^+$-silicon substrate 21.

A source electrode 27 is formed on and connected to the P-base diffusion regions 23a and 23b and the N$^+$-source diffusion regions 24a to 24d. A drain electrode 28 is formed on a surface of the N$^+$-silicon substrate 21 opposite the N-epitaxial layers 22a to 22c.

The second embodiment differs from the first embodiment in that the layers formed at the center of the P-base diffusion regions 23a and 23b and the P-epitaxial layers 20a and 20b are the P$^+$-epitaxial layers 33a and 33b having a high concentration. However, as in the first embodiment, the second embodiment also provides an advantage in that the impurity concentration of the N-epitaxial layers 22a to 22c can be high to remarkably reduce the ON-resistance of the MOSFET. Furthermore, as in the first embodiment, the second embodiment also employs the P-epitaxial layers 20a and 20b, which have an impurity concentration the same as that of the N-epitaxial layers 22a to 22c, thereby solving a problem in that the reverse breakdown voltage between the source and drain decreases due to an increase in the impurity concentration of the N-epitaxial layers 22a to 22c.

The first embodiment includes steps of forming the thermally oxidized insulating film and the polycrystalline silicon layer to fill up each trench, while the second embodiment does not need these steps. Specifically, the second embodiment allows continuous epitaxial growth to be performed in order to fill up each trench, after the P-epitaxial layer is formed, thereby simplifying the manufacturing steps.

In the first and second embodiments, as shown in FIG. 3, when the trenches are selectively formed in the N-epitaxial layer 22, they are formed to have a depth reaching the N$^-$+-silicon substrate 21 from the surface of the N-epitaxial layer 22. However, the trenches may not reach the N$^+$-silicon substrate 21, but terminate at positions in the N-epitaxial layer 22, leaving a width of the layer 22, which corresponds to that of the P-epitaxial layer 20 to be formed thereafter. Even in this case, it is possible to obtain a decrease in the ON-resistance and an improvement in the reverse breakdown voltage between the source and drain, as in the first and second embodiments.

(Third Embodiment)

FIG. 10 is a sectional view showing a planar-type insulated-gate field effect transistor (MOSFET) according to a third embodiment of the present invention. A plurality of second N-epitaxial layers 34a to 34c are formed with a gap therebetween on an N$^+$-silicon substrate 21. The structure of a P-region/a first N-epitaxial layer/a P-region is sandwiched in each of the gap between the second N-epitaxial layers. For example, a P-region 35a, a first N-epitaxial layer 36a, and a P-region 35b are formed between the second N-epitaxial layers 34a and 34b.

In order to obtain a reverse breakdown voltage of 500 to 600V between the source and drain, each thickness of the second N-epitaxial layers 34a to 34c, the P-regions 35a to 35e, and the first N-epitaxial layers 36a to 36c is set to be 50 to 60 $\mu$m. Also in this case, the second N-epitaxial layers 34a to 34c, the P-regions 35a to 35e, and the first N-epitaxial layers 36a to 36c are formed to have an impurity concentration of about $1\times10^{15}$ cm$^{-3}$. The N$^+$-silicon substrate 21 has a high impurity concentration of $1\times10^{19}$ cm$^{-3}$ to $1\times10^{20}$ cm$^{-3}$.

The N$^+$-silicon substrate 21 and the second N-epitaxial layers 34a to 34c work as the drain region of the MOSFET. P-base diffusion regions 23a to 23c are selectively formed by diffusion in the surface portions (the upper portions) of the first N-epitaxial layers 36a to 36c and the P-regions 35a to 35e. N$^+$-source diffusion regions 24a to 24e are selectively formed in the surfaces of the P-base diffusion regions 23a to 23c, respectively. Each of the second N-epitaxial layers 34a to 34c has a trench, which is filled with a thermally oxidized insulating film 37 formed on the sidewall and a polycrystalline silicon layer 38.

A gate electrode 26 of polycrystalline silicon is formed, through a gate oxide film 25, on the portion that extends from the N$^+$-source diffusion region 24b and the P-base diffusion region 23a on one side, through a surface portion of the second N-epitaxial layer 34b, to the P-base diffusion region 23b and the N$^+$-source diffusion region 24c on the other side. The gate electrode 26 is covered with an inter-level insulating film 31. In the same manner, a gate electrode is formed, through a gate oxide film, on each of the other second N-epitaxial layers formed on the N$^+$-silicon substrate 21. In other words, a combination of source, drain, channel, and gate, which constitutes each MOSFET unit, is repeatedly formed on the N$^+$-silicon substrate 21.

A source electrode 27 is formed on and connected to the P-base diffusion regions 23a to 23c and the N$^+$-source diffusion regions 24a to 24e. A drain electrode 28 is formed on a surface of the N$^+$-silicon substrate 21 opposite the second N-epitaxial layers 34a to 34c.

The MOSFET is formed of the N$^+$-source diffusion regions 24a to 24e and the second N-epitaxial layers 34a to 34c, with channel regions using surface portions of the P-base diffusion regions 23a to 23c under the gate electrodes 26. When the gate electrodes 26 are supplied with a positive voltage higher than a threshold value, an inversion layer appears in the surface of each channel region to bring the MOSFET into an ON-state. The ON-current flows from the drain electrode 28, through the N$^+$-silicon substrate 21, the second N-epitaxial layers 34a to 34c, the channel regions, and the N$^+$-source diffusion regions 24a to 24e, into the source electrode 27.

Also in this planar-type insulated-gate field effect transistor according to the third embodiment, the impurity concentration of the second N-epitaxial layers 34a to 34c can be increased, so that the ON-resistance of the MOSFET is remarkably reduced, as in the first and second embodiments. The third embodiment employs the P-regions 35a to 35e, which have an impurity concentration the same as that of the second N-epitaxial layers 34a to 34c, thereby solving a problem in that the reverse breakdown voltage between the source and drain decreases due to an increase in the impurity concentration of the second N-epitaxial layers 34a to 34c.

Specifically, since the first and second N-epitaxial layers and the P-regions are repeatedly disposed in strips, depletion layers can expand in both the P- and N-regions while keeping balance therebetween when a reverse bias is applied between the source and drain in an OFF-state of the MOSFET.

An explanation will be give of steps of manufacturing the planar-type insulated-gate field effect transistor according to the third embodiment, with reference to FIGS. 11 to 18. First, as shown in FIG. 11, a first N-epitaxial layer 36 having an impurity concentration of about $1\times10^{15}$ cm$^{-3}$ is formed on an N$^+$-silicon substrate 21 having a high impurity concentration. Then, as shown in FIG. 12, the first N-epitaxial layer 36 is etched down to the N$^+$-silicon substrate 21 to selectively form trenches. Consequently, the first N-epitaxial layer 36 is divided into portions 36a to 36c. Then, in order to remove distortion and crystal defects generated by the trench formation, a thermal oxidizing treatment is performed. A thermally oxidized film formed on the surface by the thermal oxidizing treatment is completely removed.

Figure 13:
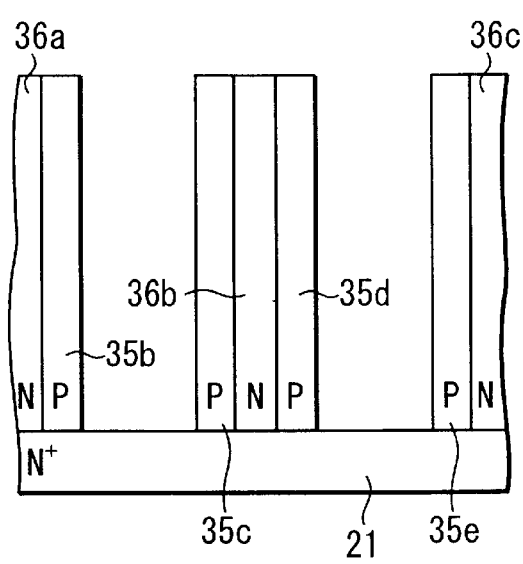
Figure 14:
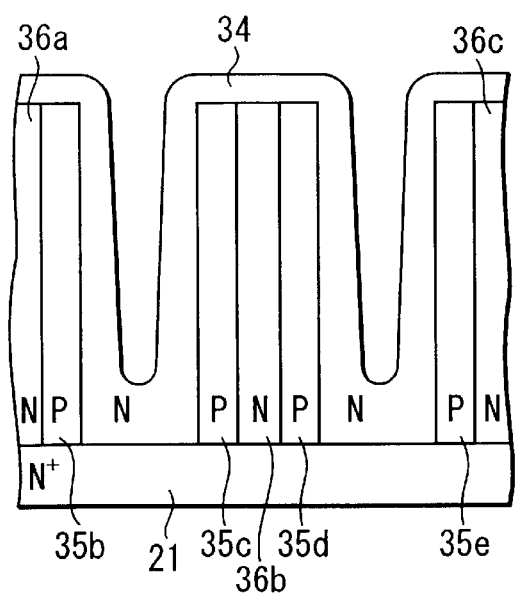

Then, as shown in FIG. 13, P-impurity ions, such as boron, are implanted and diffused along the side surfaces of the first N-epitaxial layers, which are free from distortion, so that P-regions 35b to 35e having an impurity concentration of about $1\times10^{15}$ cm$^{-3}$ are formed. Then, as shown in FIG. 14, a second N-epitaxial layer 34 is formed by crystal growth on the N$^+$-silicon substrate 21 and the first N-epitaxial layers 36a to 36c. The impurity concentration of the second N-epitaxial layer 34 is about $1\times10^{15}$ cm$^{-3}$, the same as that of the first N-epitaxial layer and the P-regions 35b to 35e.

Figure 15:
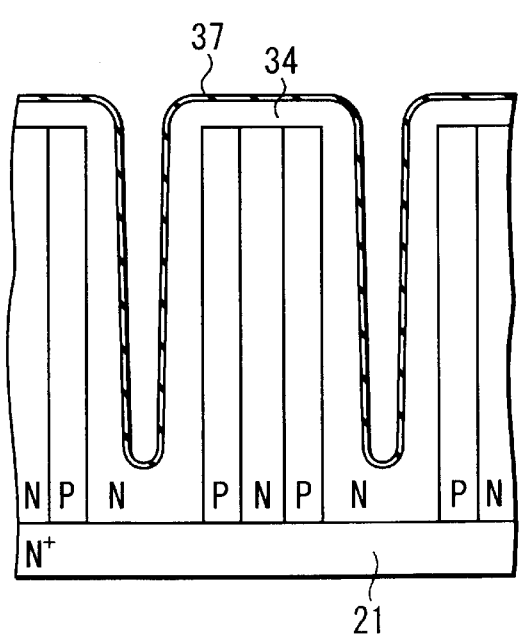
Figure 16:
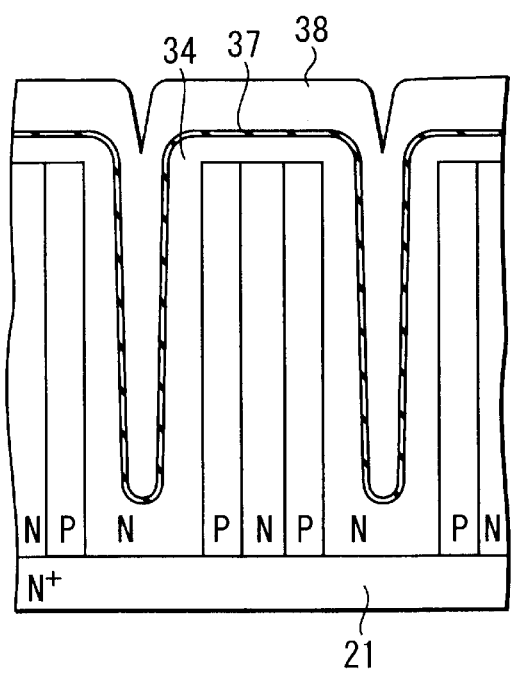

Since the sidewalls of the trenches (the P-regions 35b to 35e ) and the bottoms of the trenches (the N$^+$-silicon substrate 21) have crystal orientations different from each other, the trenches are not completely filled up by this epitaxial growth, so it is difficult to sufficiently maintain the strength of the substrate. For this reason, as shown in FIG. 15, a thermally oxidized insulating film 37 is formed by a thermal treatment . Then, as shown in FIG. 16, a polycrystalline silicon layer 38 is formed on the insulating film 37 to completely fill up the trenches therewith.

Figure 17:
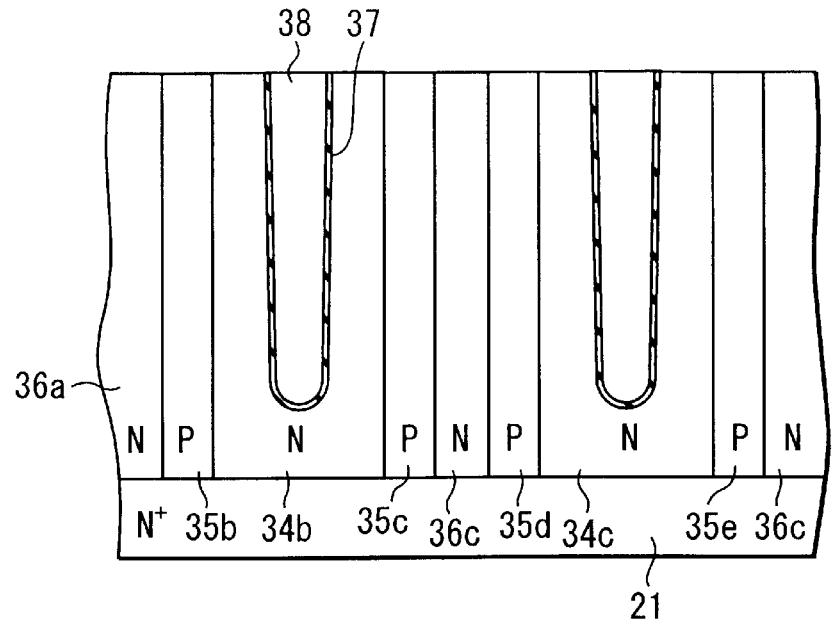

In this state, distortion has not been thoroughly removed from the substrate surface portion (the upper portion) where gate oxide films 25 of the MOSFET are to be form ed in a later step. Accordingly, polishing or etching is performed to planarize the surface of the structure obtained after the polycrystalline silicon layer 38 is formed. With the planarization, as shown in FIG. 17, the substrate surface portions of the thermally oxidized insulating film 29, the polycrystalline silicon layer 38, the second N-epitaxial layers 34b and 34c, the P-regions 35b to 35e, and the first N-epitaxial layers 36a to 36c are removed. Furthermore, with the planarization, the thickness of the second N-epitaxial layers 34b and 34c, the P-regions 35b to 35e, and the first N-epitaxial layers 36a to 36c is adjusted to a predetermined value. According to the third embodiment, in order to obtain a reverse breakdown voltage of 500 to 600V between the source and drain, each thickness of these layers is set to be 50 to 60 μm.

Figure 18:
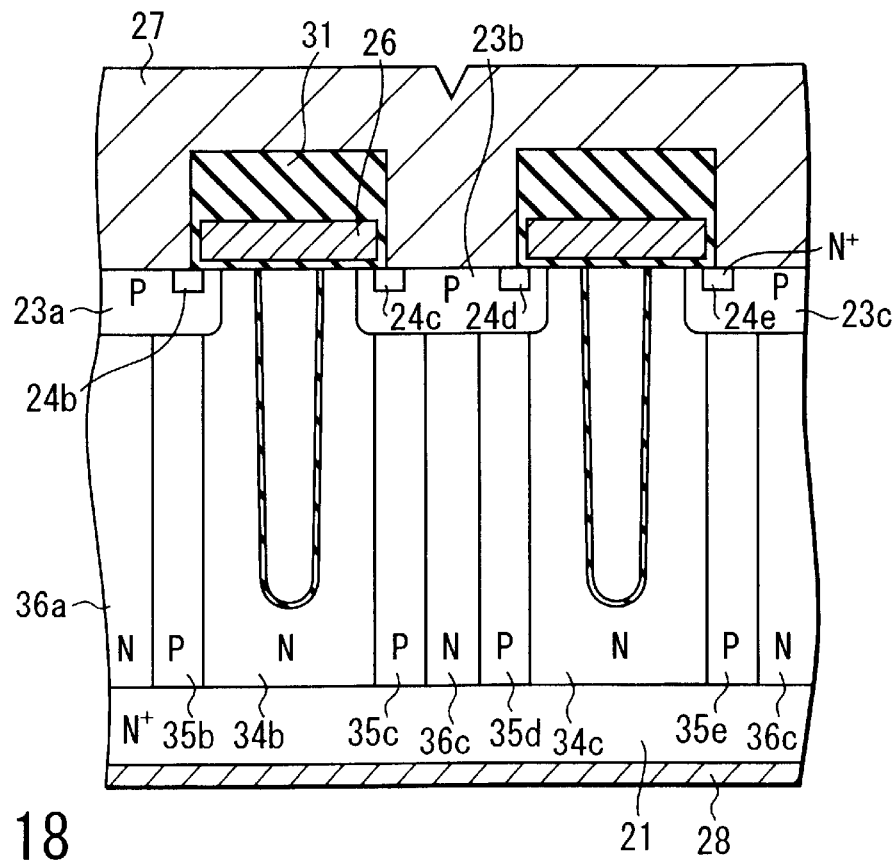

Then, as shown in FIG. 18, P-base diffusion regions 23a to 23c are selectively formed in the substrate surface portions (the upper portions) of the first N-epitaxial layers 36a to 36c and the P-regions 35a to 35e by diffusing a P-impurity. Furthermore, N$^+$-source diffusion regions 24a to 24e are selectively formed in the surfaces of the P-base diffusion regions 23a to 23c by diffusing an N-impurity.

Then, gate oxide films 25, gate electrodes 26, and inter-level insulating films 31 are formed. Then, a source electrode 27 is formed on and connected to the P-base diffusion regions 23a to 23c and the N$^+$-source diffusion regions 24a to 24e. Furthermore, a drain electrode 28 is formed on a surface of the N$^+$-silicon substrate 21.

According to this manufacturing method, the first and second N-epitaxial layers and the P-regions are easily formed to have impurity concentrations, which are the same as each other, and are uniform in the thickness direction of the substrate. As a result, it is possible to realize a device having a stable reverse breakdown voltage between the source and drain.

In the third embodiment, as shown in FIG. 12, when the trenches are selectively formed in the N-epitaxial layer 36, they are formed to have a depth reaching the N$^+$-silicon substrate 21 from the surface of the N-epitaxial layer 36. However, the trenches may not reach the N$^+$-silicon substrate 21, but terminate at positions in the N-epitaxial layer 36, leaving a width of the layer 36, which corresponds to that of the N-epitaxial layer 34 to be formed thereafter. Even in this case, it is possible to obtain a decrease in the ON-resistance and an improvement in the reverse breakdown voltage between the source and drain, as in the third embodiment.

(Fourth Embodiment)

Figure 24:
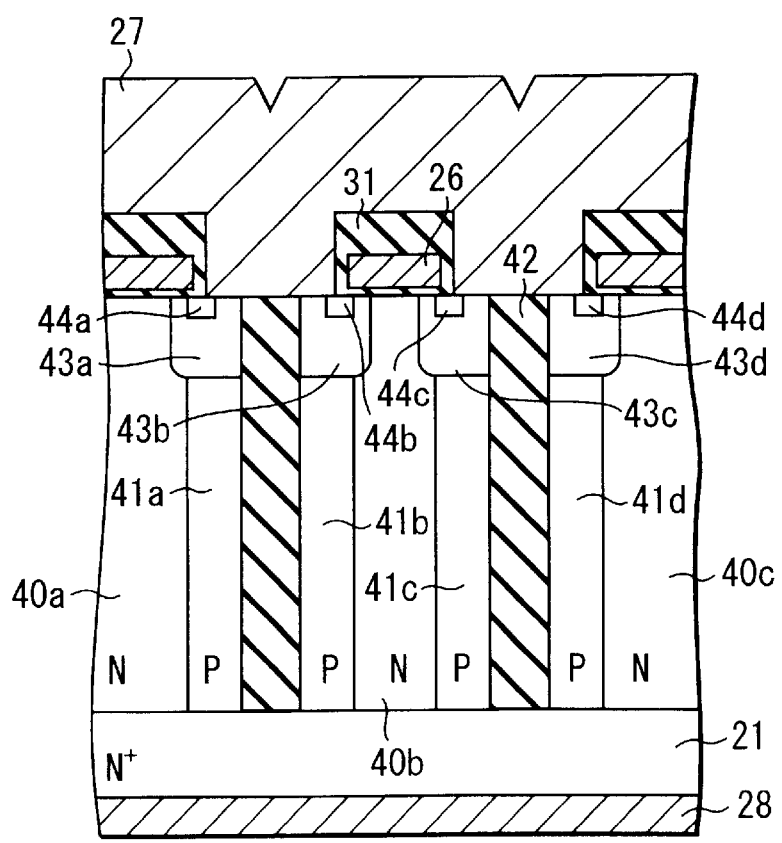
FIG. 24 is a sectional view showing the semiconductor device according to the fourth embodiment.

FIG. 24 is a sectional view showing a planar-type insulated-gate field effect transistor (MOSFET) according to a fourth embodiment of the present invention. A plurality of N-epitaxial layers 40a to 40c and a plurality of P-regions 41a to 41d are repeatedly formed in strips on an N$^+$-silicon substrate 21.

In order to obtain a reverse breakdown voltage of 500 to 600V between the source and drain, each thickness of the N-epitaxial layers 40a to 40c and the P-regions 41a to 41d is set to be 50 to 60 μm. Also in this case, the N-epitaxial layers 40a to 40c and the P-regions 41a to 41d are formed to have an impurity concentration of about $1\times10^{15}$ cm$^{-3}$. The N$^+$-silicon substrate 21 has a high impurity concentration of $1\times10^{19}$ cm$^{-3}$ to $1\times10^{20}$ cm$^{-3}$.

The N$^+$-silicon substrate 21 and the N-epitaxial layers 40a to 40c work as the drain region of the MOSFET. P-base diffusion regions 43a to 43d are selectively formed by diffusion in the surface portions (the upper portions) of the P-regions 41a to 41d, respectively. N$^+$-source diffusion regions 44a to 44d are selectively formed in the surfaces of the P-base diffusion regions 43a to 43d, respectively. A trench reaching the N$^+$-silicon substrate 21 is formed in each portion between the P-base diffusion regions 43a and 43b and between the P-base diffusion regions 43c and 43d. Each trench is filled with an insulating layer 42 formed of, e.g., an insulating oxide film, an insulating oxide, or another insulating substance.

A gate electrode 26 of polycrystalline silicon is formed, through a gate oxide film, on the portion that extends from the N$^+$-source diffusion region 44b and the P-base diffusion region 43b on one side, through a surface portion of the N-epitaxial layer 40b, to the P-base diffusion region 43c and the N$^+$-source diffusion region 44c on the other side. The gate electrode 26 is covered with an inter-level insulating film 31. In the same manner, a gate electrode is formed, through a gate oxide film, on each of the other N-epitaxial layers formed on the N$^+$-silicon substrate 21. In other words, a combination of source, drain, channel, and gate, which constitutes each MOSFET unit, is repeatedly formed on the N$^+$-silicon substrate 21.

A source electrode 27 is formed on and connected to the P-base diffusion regions 43a to 43d and the N+-source diffusion regions 44a to 44d. A drain electrode 28 is formed on the reverse surface of the N+-silicon substrate 21.

An explanation will be give of steps of manufacturing the planar-type insulated-gate field effect transistor according to the fourth embodiment, with reference to FIGS. 19 to 24. First, as shown in FIG. 19, an N-epitaxial layer 40 having an impurity concentration of about $1\times10^{15}$ cm$^{-3}$ is formed on an N+-silicon substrate 21 having a high impurity concentration. Then, as shown in FIG. 20, the N-epitaxial layer 40 is etched down to the N+-silicon substrate 21 to selectively form trenches. Consequently, the N-epitaxial layer 40 is divided into portions 40a to 40c. Then, in order to remove distortion and crystal defects generated by the trench formation, a thermal oxidizing treatment is performed. A thermally oxidized film formed on the surface by the thermal oxidizing treatment is completely removed.

Figure 23:
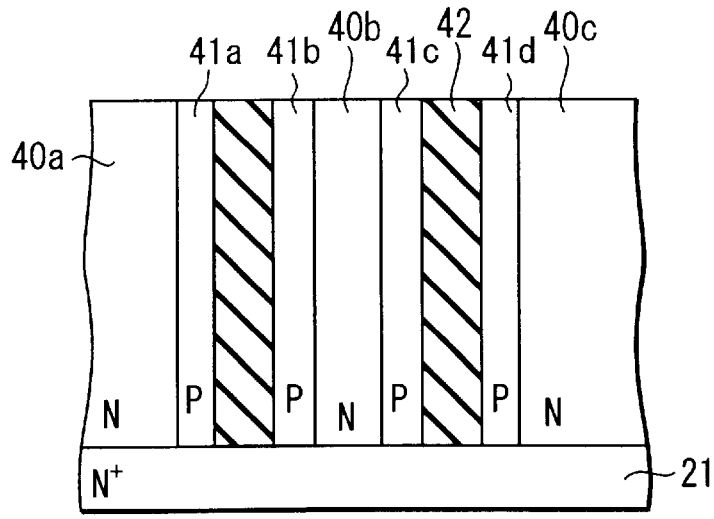

Then, as shown in FIG. 21, P-impurity ions, such as boron, are implanted and diffused along the side surfaces of the N-epitaxial layers, which are free from distortion, so that P-regions 41a to 41d are formed. The impurity concentration of P-regions 41a to 41d is $1\times10^{15}$ cm$^{-3}$, the same as that of the N-epitaxial layers 40a to 40c. Then, as shown in FIG. 22, an insulating layer 42 formed of, e.g., an insulating oxide film, an insulating oxide, or another insulating substance, is formed on the resultant structure to completely fill up the trenches therewith. Then, polishing or etching is performed to planarize the surface of the structure obtained after the insulating layer 42 is formed. With the planarization, as shown in FIG. 23, the substrate surface portions of the insulating layer 42, the N-epitaxial layers 40a to 40c, and the P-regions 41a to 41d are removed. Furthermore, with the planarization, the thickness of the N-epitaxial layers 40a to 40c and the P-regions 41a to 41d is adjusted to a predetermined value. According to the fourth embodiment, in order to obtain a reverse breakdown voltage of 500 to 600V between the source and drain, each thickness of the N-epitaxial layers 40a to 40c and the P-regions 41a to 41d is set to be 50 to 60 μm.

Then, as shown in FIG. 23, P-base diffusion regions 43a to 43d are selectively formed in the substrate surface portions (the upper portions) of and the P-regions 41a to 41d by diffusing a P-impurity. Furthermore, N+-source diffusion regions 44a to 44d are selectively formed in the surfaces of the P-base diffusion regions 43a to 43d by diffusing an N-impurity. Then, gate oxide films, gate electrodes 26, and inter-level insulating films 31 are formed. Then, a source electrode 27 is formed on and connected to the P-base diffusion regions 43a to 43d and the N+-source diffusion regions 44a to 44d. Furthermore, a drain electrode 28 is formed on a surface of the N+-silicon substrate 21.

According to this manufacturing method, the N-epitaxial layers and the P-regions are easily formed to have impurity concentrations, which are the same as each other, and are uniform in the thickness direction of the substrate. As a result, it is possible to realize a device having a stable reverse breakdown voltage between the source and drain.

As described above, according to the first to fourth embodiments of the present invention, the impurity concentration of semiconductor layers functioning as the drain of a MOSFET can be higher than that of the conventional structures. As a result, the ON-resistance of the device is reduced. When a reverse bias is applied between the source and drain, semiconductor layers of the first conductivity type (drain region) and semiconductor layers of the second conductivity type, which are juxtaposed each other, are completely depleted. As a result, the breakdown voltage of the device is improved. Furthermore, semiconductor layers of the first conductivity type (drain region) and semiconductor layers of the second conductivity type adjacent thereto are easily formed to have impurity concentrations, which are the same as each other, and are uniform in the thickness direction of the substrate. As a result, it is possible to realize a device having a stable reverse breakdown voltage between the source and drain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type;
    a first semiconductor layer of the first conductivity type and a second semiconductor layer of a second conductivity type juxtaposed on the semiconductor substrate, the first semiconductor layer having an impurity concentration lower than that of the semiconductor substrate, the second semiconductor layer having at a central location a trench, which extends from an upper end of the second semiconductor layer toward the semiconductor substrate;
    a first region of the second conductivity type formed to include an upper portion of the second semiconductor layer;
    a second region of the first conductivity type formed in a surface of the first region; and
    a gate electrode disposed, through an insulating film, on a channel region, which is a surface portion of the first region between the second region and an upper portion of the first semiconductor layer.

2. A device according to claim 1, further comprising a filling layer buried in the trench, the filling layer including a thermally oxidized film covering an inner surface of the trench, or consisting essentially of a semiconductor of the second conductivity type having an impurity concentration higher than that of the second semiconductor layer.

3. A semiconductor device comprising:
    a semiconductor substrate of a first conductivity type;
    a first semiconductor layer of the first conductivity type, a second semiconductor layer of a second conductivity type, and a third semiconductor layer of the first conductivity type juxtaposed on the semiconductor substrate, the first and third semiconductor layers having an impurity concentration lower than that of the semiconductor substrate, the third semiconductor layer having at a central location a trench, which extends from an upper end of the third semiconductor layer toward the semiconductor substrate;
    a first region of the second conductivity type formed to include an upper portion of the second semiconductor layer;
    a second region of the first conductivity type formed in a surface of the first region; and
    a gate electrode disposed, through an insulating film, on a channel region, which is a surface portion of the first region between the second region and an upper portion of the third semiconductor layer.

4. A device according to claim 3, further comprising a filling layer buried in the trench and including a thermally oxidized film covering an inner surface of the trench.

5. A method of manufacturing a semiconductor device, comprising:

forming a first semiconductor layer of a first conductivity type on a semiconductor substrate of the first conductivity type, the first semiconductor layer having an impurity concentration lower than that of the semiconductor substrate;

forming a first trench in the first semiconductor layer by etching, the first trench extending in a depth direction from a surface of the first semiconductor layer to the semiconductor substrate or a position near there;

forming a second semiconductor layer of a second conductivity type by crystal growth on the first semiconductor layer in the first trench, the second semiconductor layer leaving a second trench extending in a direction the same as the depth direction, at a position corresponding to the first trench;

forming a filling layer on the second semiconductor layer to embed the filling layer in the second trench;

planarizing a surface of a structure obtained by forming the filling layer;

diffusing an impurity of the second conductivity type into a region including an upper portion of the second semiconductor layer to form a first region;

diffusing an impurity of the first conductivity type into a surface of the first region to for m a second region; and forming an insulating film and a gate electrode on a channel region, which is a surface portion of t he first region between the second region and an upper portion of the first semiconductor layer.

6. A method of manufacturing a semiconductor device, comprising:

forming a first semiconductor layer of a first conductivity type on a semiconductor substrate of the first conductivity type, the first semiconductor layer having an impurity concentration lower than that of the semiconductor substrate;

forming a first trench in the first semiconductor layer by etching, the first trench extending in a depth direction from a surface of the first semiconductor layer to the semiconductor substrate or a position near there;

forming a second semiconductor layer of a second conductivity type by impurity ion implantation in a surface of the first semiconductor layer exposed in the first trench, the second semiconductor layer leaving a second trench extending in a direction the same as the depth direction, at a position corresponding to the first trench;

forming a third semiconductor layer of the first conductivity type by crystal growth on the second semiconductor layer in the second trench, the third semiconductor layer leaving a third trench extending in a direction the same as the depth direction, at a position corresponding to the second trench;

forming a filling layer on the third semiconductor layer to embed the filling layer in the third trench;

planarizing a surface of a structure obtained by forming the filling layer;

diffusing an impurity of the second conductivity type into a region including an upper portion of the second semiconductor layer to form a first region;

diffusing an impurity of the first conductivity type into a surface of the first region to form a second region; and forming an insulating film and a gate electrode on a channel region, which is a surface portion of the first region between the second region and an upper portion of the third semiconductor layer.

7. A method of manufacturing a semiconductor device, comprising:

forming a first semiconductor layer of a first conductivity type on a semiconductor substrate of the first conductivity type, the first semiconductor layer having an impurity concentration lower than that of the semiconductor substrate;

forming a first trench in the first semiconductor layer by etching, the first trench extending in a depth direction from a surface of the first semiconductor layer to the semiconductor substrate or a position near there;

forming a second semiconductor layer of a second conductivity type by impurity ion implantation in a surface of the first semiconductor layer exposed in the first trench, the second semiconductor layer leaving a second trench extending in a direction the same as the depth direction, at a position corresponding to the first trench;

forming a filling layer on the second semiconductor layer to embed the filling layer in the second trench;

planarizing a surface of a structure obtained by forming the filling layer;

diffusing an impurity of the second conductivity type into a region including an upper portion of the second semiconductor layer to form a first region;

diffusing an impurity of the first conductivity type into a surface of the first region to form a second region; and forming an insulating film and a gate electrode on a channel region, which is a surface portion of the first region between the second region and an upper portion of the first semiconductor layer.

8. A semiconductor device comprising:

a lower layer of a first conductivity type semiconductor;

a first middle layer of a first conductivity type semiconductor formed on the lower layer and having an impurity concentration lower than that of the lower layer, the first middle layer having a first trench, which extends in a depth direction from a surface of the first middle layer to the lower layer or a position near there;

a second middle layer of a second conductivity type semiconductor formed along a sidewall of the first trench, the second middle layer leaving a second trench extending in a direction the same as the depth direction, at a position corresponding to the first trench;

a filling layer buried in the second trench;

a first upper layer of a second conductivity type semiconductor formed in a region including an upper portion of the second middle layer;

a second upper layer of a first conductivity type semiconductor formed in a surface of the first upper layer; and a gate electrode disposed, through an insulating film, on a channel region, which is a surface portion of the first upper layer between the second upper layer and an upper portion of the first middle layer.

9. A device according to claim 8, wherein the second middle layer is formed on the first middle layer.

10. A device according to claim 8, wherein the second middle layer is formed in a surface of the first middle layer.

11. A device according to claim 8, wherein the first trench reaches the lower layer.

12. A device according to claim 8, wherein the filling layer comprises a thermally oxidized film covering the second trench.

13. A device according to claim 8, wherein the filling layer consists essentially of a second conductivity type semiconductor having an impurity concentration higher than that of the second middle layer.

14. A device according to claim 8, further comprising a first main electrode electrically connected to the second upper layer and a second main electrode electrically connected to the lower layer, wherein the device operates as a field effect transistor.

15. A device according to claim 8, wherein a structure formed by combining the first trench of the first middle layer, the second middle layer, the filling layer, the first upper layer, the second upper layer, and the gate electrode is repeatedly disposed on the lower layer.

16. A semiconductor device comprising:

a lower layer of a first conductivity type semiconductor;

a first middle layer of a first conductivity type semiconductor formed on the lower layer and having an impurity concentration lower than that of the lower layer, the first middle layer having a first trench, which extends in a depth direction from a surface of the first middle layer to the lower layer or a position near there;

a second middle layer of a second conductivity type semiconductor formed along a sidewall of the first trench, the second middle layer leaving a second trench extending in a direction the same as the depth direction, at a position corresponding to the first trench;

a third middle layer of a first conductivity type semiconductor formed along a sidewall of the second trench, the third middle layer leaving a third trench extending in a direction the same as the depth direction, at a position corresponding to the second trench;

a filling layer buried in the third trench;

a first upper layer of a second conductivity type semiconductor formed in a region including an upper portion of the second middle layer;

a second upper layer of a first conductivity type semiconductor formed in a surface of the first upper layer; and a gate electrode disposed, through an insulating film, on a channel region, which is a surface portion of the first upper layer between the second upper layer and an upper portion of the first or third middle layer.

17. A device according to claim 16, wherein the first trench reaches the lower layer.

18. A device according to claim 16, wherein the filling layer comprises a thermally oxidized film covering the third trench.

19. A device according to claim 16, further comprising a first main electrode electrically connected to the second upper layer and a second main electrode electrically connected to the lower layer, wherein the device operates as a field effect transistor.

20. A device according to claim 16, wherein a structure formed by combining the first trench of the first middle layer, the second middle layer, the third middle layer, the filling layer, the first upper layer, the second upper layer, and the gate electrode is repeatedly disposed on the lower layer.

* * * * *